(12) United States Patent
Hsieh et al.

(10) Patent No.: US 8,421,858 B2
(45) Date of Patent: Apr. 16, 2013

(54) INSPECTION MACHINE, INSPECTING METHOD AND INSPECTING SYSTEM

(75) Inventors: Hsiao-Liang Hsieh, Hsinchu (TW); Wen-Ti Lin, Hsinchu (TW); Hsiang-Cheng Hsieh, Hsinchu (TW)

(73) Assignee: Lextar Electronics Corp., Hsinchu (TW)

( * ) Notice: Subject to any disclaimer, the term of this patent is extended or adjusted under 35 U.S.C. 154(b) by 289 days.

(21) Appl. No.: 13/039,276

(22) Filed: Mar. 2, 2011

(65) Prior Publication Data
US 2012/0140059 A1    Jun. 7, 2012

(30) Foreign Application Priority Data

Dec. 3, 2010  (TW) .............................. 99142174 A
Dec. 3, 2010  (TW) .............................. 99223572 U

(51) Int. Cl.
*H04N 9/47*      (2006.01)
*G06K 9/00*      (2006.01)
(52) U.S. Cl.
USPC ............................................ 348/92; 382/141
(58) Field of Classification Search .......... 348/92, 348/86; 382/141–145
See application file for complete search history.

(56) References Cited

U.S. PATENT DOCUMENTS

2006/0033919 A1 * 2/2006 Moshe ........................ 356/430

FOREIGN PATENT DOCUMENTS

| TW | M345349 | 11/2008 |
|---|---|---|
| TW | 200846638 | 12/2008 |
| TW | M364207 | 9/2009 |
| TW | 201013165 | 4/2010 |
| TW | I325953 | 6/2010 |

* cited by examiner

*Primary Examiner* — David Czekaj
*Assistant Examiner* — Tsion B Owens
(74) *Attorney, Agent, or Firm* — Muncy, Geissler, Olds & Lowe, PLLC

(57) ABSTRACT

An inspection machine capable of inspecting optical property and electrical property of a light emitting device is provided. The inspection machine includes a substrate table, a probe mechanism, a heating apparatus, a cooling apparatus, an image-sensing apparatus, a temperature-sensing apparatus and a moving mechanism. The probe mechanism is capable of moving toward the light emitting device to contact therewith. The heating apparatus is capable of heating the light emitting device within a first temperature range. The cooling apparatus is capable of cooling the light emitting device within a second temperature range. The image-sensing apparatus senses a light emitting image provided from the light emitting device. The temperature-sensing apparatus senses the present temperature of the light emitting device. The image-sensing apparatus is disposed on the moving mechanism. The moving mechanism is capable of moving the image-sensing apparatus. An inspecting method and an inspecting system for the inspection machine are also provided.

32 Claims, 4 Drawing Sheets

INSPECTION MACHINE, INSPECTING METHOD AND INSPECTING SYSTEM

CROSS-REFERENCE TO RELATED APPLICATION

This application claims the priority benefit of Taiwan application serial no. 99142174, filed Dec. 3, 2010 and the priority benefit of Taiwan application serial no. 99223572, filed Dec. 3, 2010. The entirety of each of the above-mentioned patent applications are hereby incorporated by reference herein and made a part of this specification.

BACKGROUND OF THE INVENTION

1. Field of the Invention

The invention relates to an inspection machine, an inspecting method, and an inspecting system. More particularly, the invention relates to an inspection machine, an inspecting method, and an inspecting system with low cost and high yield rate.

2. Description of Related Art

Conventionally, various machines for inspecting optical property and electrical property are usually disposed to perform various optical inspections and electrical inspections to a light emitting device (i.e. a light emitting diode light bar). The light emitting device is then placed into the inspection machines sequentially for measuring optical property and electrical performance of the light emitting device. Specifically, the light emitting device is visually inspected with the retained temperature of a reflow furnace and lighted with a manual adjustment power supply and a probe mechanism lighting lamp. Afterwards, whether the LED is lighted and the appearance of the light emitting device is visually inspected. Thus, the high temperature state can not be maintained. Moreover, each visual examiner only inspects the light bar of one set of the light emitting device.

After a high temperature electrical inspection, the light emitting device has to be cooled in order to perform a low temperature electrical inspection. The light emitting device is cooled by the moving or waiting time in the fabrication or the installation of cooling apparatuses such as a fan and the like (this adds another step to the method).

In addition, when inspecting the appearance of the light emitting device, an auto optic inspection (AOI) is usually performed to inspect defects such as misalignment, lack of solder, and so on in the light emitting device. Herein, the AOI is mostly an automated machine.

Further, when inspecting the optical property of the light emitting device, the AOI is usually performed to inspect the optical property of the light emitting device. Herein, the optical inspection mostly adopts an automated machine.

Afterwards, the low temperature electrical inspection is performed through visual inspection and thus adds another step to the method. The electrical inspection also adopts the manual adjustment power supply and the handheld probe mechanism lighting lamp. Further, whether the light emitting device is lighted and the appearance of the light emitting device are visually inspected.

In light of the foregoing, the high temperature inspection and the low temperature inspection of the light emitting device require multiple steps. These machines thus occupy a lot of space and the assembly line of the light emitting device can not be shortened.

SUMMARY OF THE INVENTION

The invention is directed to an inspection machine having low cost, automation, high yield rate, and compact volume.

The invention is further directed to an inspecting method suitable for the inspection machine aforementioned.

The invention is further directed to an inspecting system suitable for the inspection machine aforementioned.

The invention is directed to an inspection machine capable of inspecting optical property and electrical property of a light emitting device. The inspection machine includes a substrate table, a probe mechanism, a heating apparatus, a cooling apparatus, an image-sensing apparatus, an optical inspection apparatus, a temperature-sensing apparatus, and a moving mechanism. The light emitting device is disposed on the substrate table. The probe mechanism is disposed above the substrate table and capable of moving toward the substrate table to contact the light emitting device. The heating apparatus is disposed below the substrate table and capable of heating the light emitting device, such that a temperature of the light emitting device is maintained within a first temperature range. When the light emitting device is within the first temperature range, the probe mechanism contacting the light emitting device is capable of transmitting a first driving signal to the light emitting device to drive the light emitting device. The cooling apparatus is disposed below the substrate table and capable of cooling the light emitting device, such that the temperature of the light emitting device is maintained within a second temperature range. When the light emitting device is within the second temperature range, the probe mechanism contacting the light emitting device is capable of transmitting a second driving signal to the light emitting device to drive the light emitting device. The image-sensing apparatus is disposed above the light emitting device and capable of sensing a light emitting image generated when the light emitting device is driven and an appearance of the light emitting device. The temperature-sensing apparatus is disposed above the light emitting device to sense a present temperature of the light emitting device. The moving mechanism is disposed above the light emitting device. The image-sensing apparatus is disposed on the moving mechanism, where the moving mechanism is capable of moving the image-sensing apparatus.

In one embodiment of the invention, the substrate table includes a conveyor belt device capable of carrying and transporting the light emitting device.

In one embodiment of the invention, the heating apparatus includes a heating block or a heating plate.

In one embodiment of the invention, the first temperature range substantially ranges from 120° C. to 200° C.

In one embodiment of the invention, the cooling apparatus includes a water circulating system or a gas ejecting system.

In one embodiment of the invention, the second temperature range substantially ranges from 20° C. to 70° C.

In one embodiment of the invention, the second driving signal is greater or smaller than the first driving signal.

In one embodiment of the invention, the image-sensing apparatus includes a line scan charge coupling device (CCD).

In one embodiment of the invention, the inspection machine further includes a power supply apparatus which is electrically connected to the probe mechanism and provides the first driving signal or the second driving signal.

In one embodiment of the invention, the inspection machine further includes an optical inspection apparatus disposed above the light emitting device and installed on the moving mechanism. The moving mechanism is capable of moving the optical inspection apparatus. The optical inspection apparatus is capable of measuring an optical property generated when the light emitting device is driven.

In one embodiment of the invention, the inspection machine further includes a first moving apparatus and a second moving apparatus. The first moving apparatus is disposed above the substrate table and capable of moving the probe mechanism for the probe mechanism to move toward or away from the substrate table. The second moving apparatus is disposed below the substrate table and capable of moving the heating apparatus and the cooling apparatus for one of the heating apparatus and the cooling apparatus to move toward the substrate table.

In one embodiment of the invention, the inspection machine further includes at least one blowing mechanism disposed on one side or respective sides of the substrate table. The blowing mechanism is capable of providing an airflow to the light emitting device to cool the light emitting device.

In one embodiment of the invention, the inspection machine further includes an operator and an interface card. The operator moves at least one of the probe mechanism, the heating apparatus, the cooling apparatus, and the moving mechanism through the interface card, or retrieves data from at least one of the image-sensing apparatus and the temperature-sensing apparatus through the interface card.

In one embodiment of the invention, the interface card includes a motion control card or an image retrieval card.

In one embodiment of the invention, the light emitting device includes a light emitting diode (LED) light bar.

The invention is further directed to an inspecting method capable of inspecting optical property and electrical property of a light emitting device. The inspecting method at least includes the following steps. Firstly, a light emitting device is provided. A probe mechanism is then provided for the probe mechanism to move toward the substrate table so as to contact the light emitting device. The light emitting device is heated to maintain a temperature of the light emitting device within a first temperature range. A first driving signal is next transmitted to the light emitting device using the probe mechanism to drive the light emitting device. Thereafter, a first light emitting image generated when the light emitting device is driven by the first driving signal is sensed and measured. The light emitting device is cooled to maintain the temperature thereof within a second temperature range. Afterwards, a second driving signal is transmitted to the light emitting device using the probe mechanism to drive the light emitting device. A second light emitting image generated when the light emitting device is driven by the second driving signal is sensed and measured. The second driving signal is greater than the first driving signal.

In one embodiment of the invention, before moving the probe mechanism toward the substrate table to contact the light emitting device, the inspecting method further includes positioning the light emitting device using an image-sensing apparatus. In one embodiment of the invention, before positioning the light emitting device, the inspecting method further includes performing a bar code scan to the light emitting device.

In one embodiment of the invention, after cooling the light emitting device and before transmitting the second driving signal to the light emitting device, the inspecting method further includes inspecting an appearance or a position of the light emitting device using an image-sensing apparatus.

In one embodiment of the invention, after sensing and measuring the second light emitting image, the inspecting method further includes inspecting an electrical property and an optical property of the light emitting device.

The invention is further directed to an inspecting system capable of inspecting optical property and electrical property of a light emitting device. The inspecting system includes the substrate table, the probe mechanism, the heating apparatus, the cooling apparatus, and the image-sensing apparatus. The light emitting device is disposed on the substrate table. The probe mechanism moves toward the substrate table to contact with the light emitting device. The heating apparatus heats the light emitting device such that a temperature of the light emitting device is maintained within a first temperature range. Moreover, the heating apparatus transmits a first driving signal to the light emitting device using the probe mechanism to drive the light emitting device. The cooling apparatus cools the light emitting device such that the temperature of the light emitting device is maintained within a second temperature range. Moreover, the cooling apparatus transmits a second driving signal to the light emitting device using the probe mechanism to drive the light emitting device. The image-sensing apparatus is capable of sensing and measuring a first light emitting image generated when the light emitting device is driven by the first driving signal, and sensing and measuring a second light emitting image generated with the light emitting device is driven by the second driving signal. Here, the second driving signal is greater than the first driving signal.

In one embodiment of the invention, before moving the probe mechanism toward the substrate table to contact the light emitting device, the inspecting system further includes positioning the light emitting device using an image-sensing apparatus. In one embodiment of the invention, before positioning the light emitting device, the inspecting system further includes performing a bar code scan to the light emitting device.

In one embodiment of the invention, after cooling the light emitting device and before transmitting the second driving signal to the light emitting device, the inspecting system further includes inspecting an appearance or a position of the light emitting device using an image-sensing apparatus.

In one embodiment of the invention, after sensing and measuring the second light emitting image, the inspecting system further includes inspecting an electrical property and an optical property of the light emitting device.

Accordingly, the substrate table, the probe mechanism, the heating apparatus, the cooling apparatus, the image-sensing apparatus, the temperature-sensing apparatus, and the moving mechanism are integrated in the invention, so that the volume and length of the assembly line required for inspecting the light emitting device can be greatly reduced. That is, the light emitting device disposed on the substrate table of the inspection machine of the present embodiment can undergo the high temperature inspection, the low temperature inspection, and the optical property quality inspection without moving. Thus, the overall volume and the quantity of apparatuses of the inspection machine of the present embodiment are greatly reduced comparing to those of the conventional inspection machines.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1:
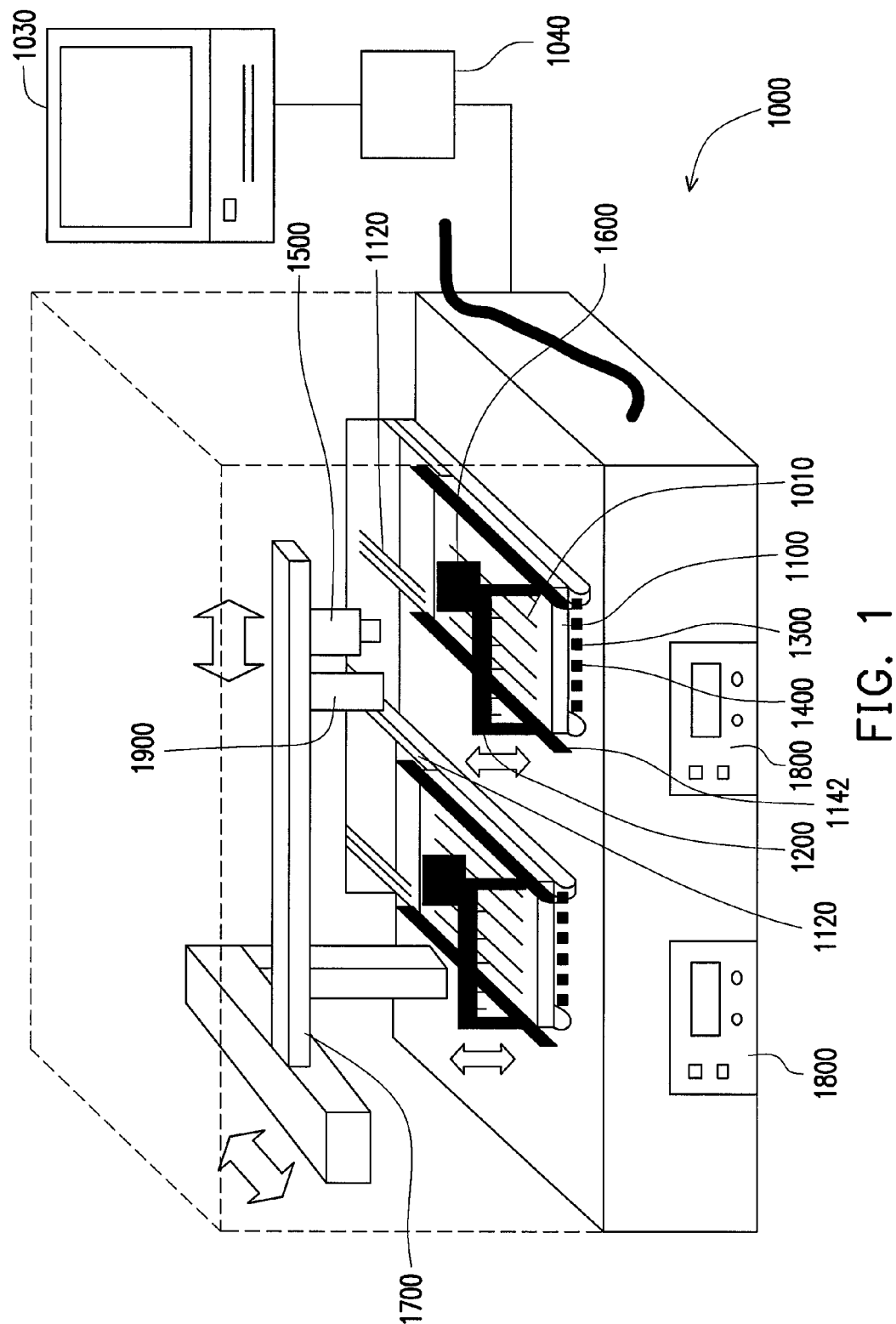
FIG. 1 is a schematic diagram illustrating an inspection machine according to an embodiment of the invention.
Figure 2:
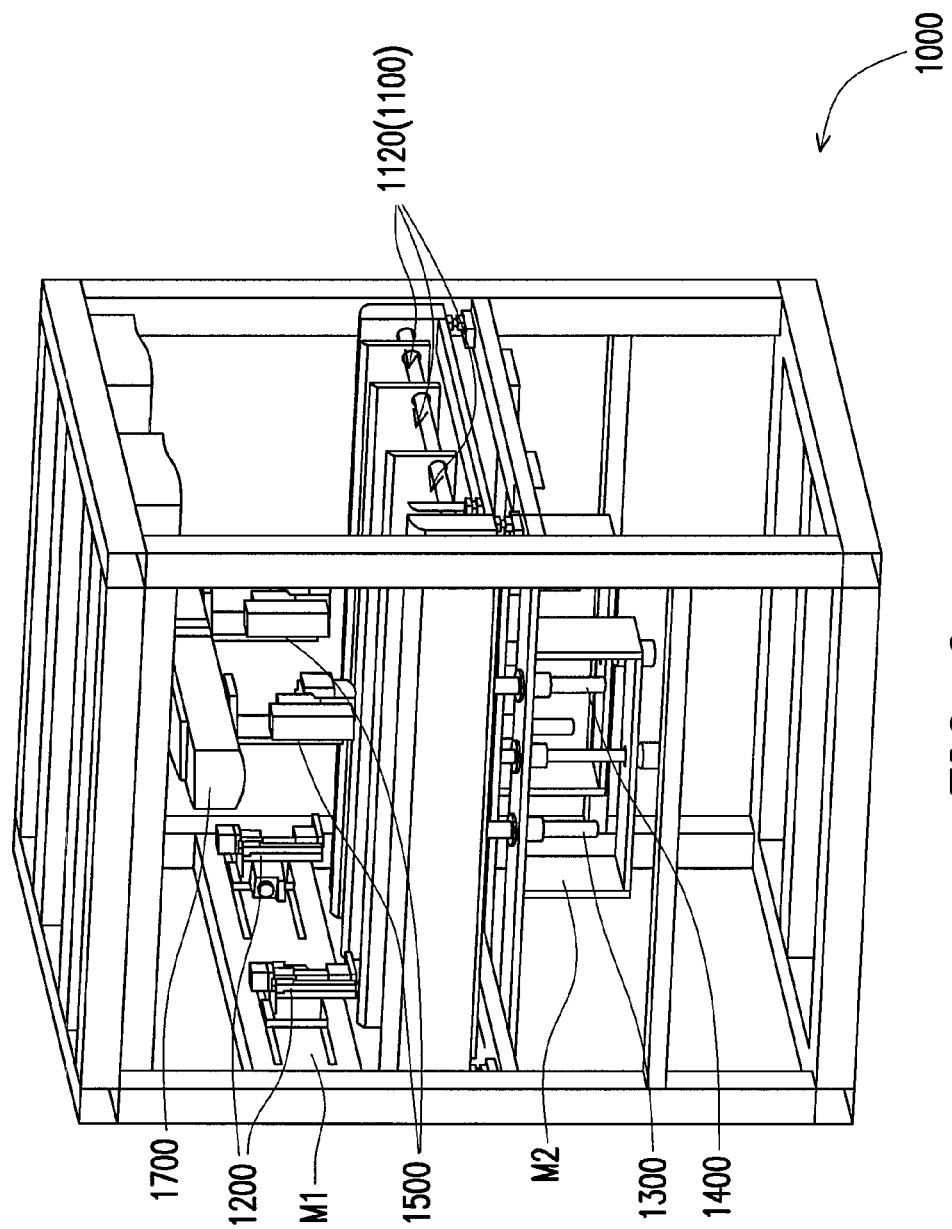
FIG. 2 is a partial three-dimensional diagram of a specific embodiment of the inspection machine in FIG. 1.
Figure 3:
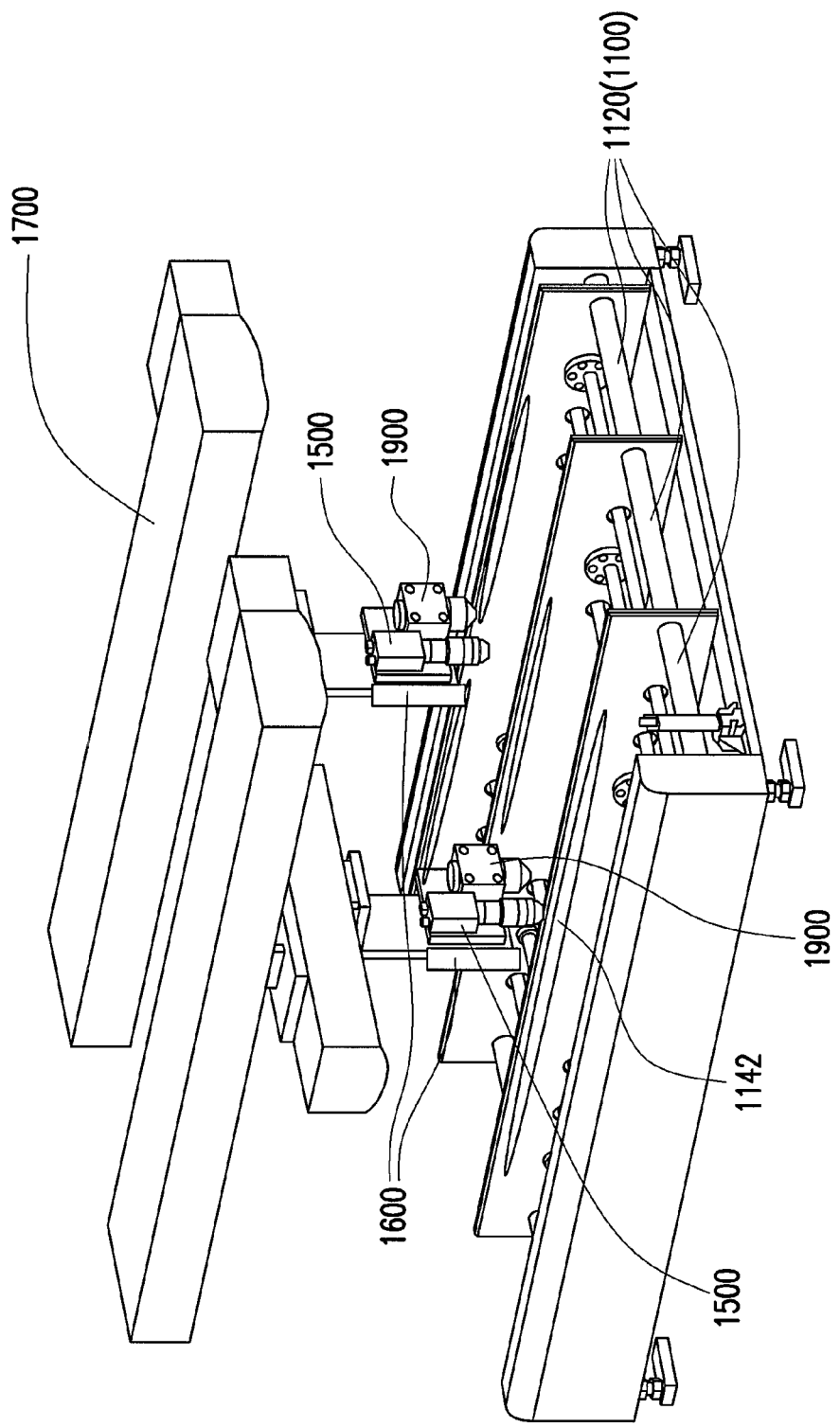
FIG. 3 is a partial enlarged schematic diagram of the inspection machine in FIG. 2.

FIG. 1 is a schematic diagram illustrating an inspection machine according to an embodiment of the invention. FIG. 2 is a partial three-dimensional (3D) diagram of a specific embodiment of the inspection machine in FIG. 1. FIG. 3 is a partial enlarged schematic diagram of the inspection machine in FIG. 2. Referring to FIGS. 1, 2, and 3, an inspection machine 1000 of the present embodiment is capable of inspecting optical property and electrical property of a light emitting device 1010. Specifically, the inspection machine 1000 includes a substrate table 1100, a probe mechanism 1200, a heating apparatus 1300, a cooling apparatus 1400, an image-sensing apparatus 1500, a temperature-sensing apparatus 1600, and a moving mechanism 1700. The light emitting device 1010 is disposed on the substrate table 1100. In the present embodiment, the substrate table 1100 is shown as a conveyor belt device 1120 in FIGS. 2 and 3 as an example, but is not limited thereto. Specifically, the conveyor belt device 1120 is capable of carrying the light emitting device 1010 and transporting the light emitting device 1010 to a fixed position. In addition, the light emitting device 1010 of the present embodiment is, for example, a light emitting diode (LED) light bar.

The probe mechanism 1200 is disposed above the substrate table 1100 and capable of moving toward the substrate table 1100 to contact the light emitting device 1010. Specifically, the inspection machine 1000 includes a first moving apparatus M1. The first moving apparatus M1 is disposed above the substrate table 1100 and capable of moving the probe mechanism 1200 for the probe mechanism 1200 to move toward or away from the substrate table 1100 as shown in FIGS. 1, 2, and 3. In general, the probe mechanism 1200 mainly applies voltage or current to the light emitting device 1010 for the light emitting device 1010 to generate a light beam. Thereafter, the quality of the light emitting device 1010 can be inspected through the value of the voltage or current applied. In other words, the probe mechanism 1200 is mainly adopted in the step of inspecting the light emitting device 1010. The probe mechanism 1200 moves toward the substrate table 1100 for the probe mechanism 1200 to contact the light emitting device 1010 and electrically connect with the same. Herein, the voltage or the current signal applied from the probe mechanism 1200 to the light emitting device 1010 and the operation of the probe mechanism 1200 is further illustrated in the subsequent paragraphs.

Referring to FIGS. 1, 2, and 3 simultaneously, the heating apparatus 1300 is disposed below the substrate table 1100 and capable of heating the light emitting device 1010, so that a temperature of the light emitting device 1010 is maintained within a first temperature range T1. In the present embodiment, the heating apparatus 1300 adopts a heating block or a heating plate. In particular, after the light emitting device 1010 finishes a process in a reflow furnace, an electrical property and an optical property of the light emitting device 1010 driven by high temperature can first be measured. Thus, the inspection machine 1000 of the present embodiment can heat up the light emitting device 1010 through the heating apparatus 1300 disposed below the substrate table 1100, so that the light emitting device 1010 is maintained within the first temperature range T1. Herein, the first temperature range T1 substantially ranges from 120° C. to 200° C. It should be noted that before the heating apparatus 1300 heats up the light emitting device 1010, the probe mechanism 1200 has to move toward the substrate table 1100 for the probe mechanism to contact and electrically connect with the light emitting device 1010.

Next, when the heating apparatus 1300 heats up the light emitting device 1010 to maintain the temperature thereof within the first temperature range T1, the probe mechanism 1200 can transmit a first driving signal S1 to the light emitting device 1010 for driving the light emitting device 1010 to generate light. In the present embodiment, the inspection machine 1000 includes a power supply apparatus 1800. The power supply apparatus 1800 is electrically connected to the probe mechanism 1200 and provides the first driving signal S1. In the present embodiment, the first driving signal S1 is, for example, a current signal and is substantially 50 uA.

Additionally, an image-sensing apparatus 1500 is disposed above the light emitting device 1010 and capable of sensing a light emitting image generated when the light emitting device 1010 is driven, as shown in FIGS. 1, 2, and 3. Specifically, when the probe mechanism 1200 drives the light emitting device 1010 within the first temperature range T1 so that the light emitting device 1010 generates light, the inspection machine 1000 of the present embodiment senses the light generated when the light emitting device 1010 is driven through the image-sensing apparatus 1500. At the same time, whether LEDs on the LED light bar are lighted is inspected rapidly so as to determine whether the light emitting device 1010 is an operative light emitting device under high temperature. In the present embodiment, the image-sensing apparatus 1500 adopts a line scan charge coupling device (CCD) 1520 which is capable of scanning and sensing the lighting status of the light emitting device 1010 rapidly. Comparing to the conventional method adopting artificial vision to determine whether a plurality of LEDs on the LED light bar is lighted, the inspection machine 1000 of the present embodiment functions at a faster speed and is more accurate.

Referring to FIGS. 1, 2, and 3 continuously, the temperature-sensing apparatus 1600 is disposed above the light emitting device 1010 to sense a current temperature of the light emitting device 1010. The temperature-sensing apparatus 1600 is, for example, an infrared heat sensing apparatus which is capable of sensing the current temperature of the light emitting device 1010 directly without contacting the light emitting device 1010. Therefore, the inspection machine 1000 of the present embodiment is capable of monitoring whether the heating apparatus 1300 has heated the light emitting device 1010 to be within the first temperature range T1. If the light emitting device 1010 has not yet been heated to reach the first temperature range T1, the heating apparatus 1300 continues the heating.

In the inspection machine 1000, the cooling apparatus 1400 is disposed below the substrate table 110 and capable of cooling the light emitting device 1010 for the light emitting device 1010 to maintain within a second temperature range T2, as depicted in FIGS. 1, 2, and 3. In the present embodiment, the cooling apparatus 1400 includes a water circulating system or a gas ejecting system. After the lighting status of the light emitting device 1010 is inspected under high temperature, the optical property and the electrical property of the light emitting device 1010 driven by low temperature can be measured. Thus, the inspection machine 1000 of the present embodiment can cool down the light emitting device 1010 through the cooling apparatus 1400 disposed below the substrate table 1100, so that the light emitting device 1010 is maintained within the second temperature range T2. Herein, the second temperature range T2 substantially ranges from 20° C. to 70° C. Similarly, before the cooling apparatus 1400 cools down the light emitting device 1010, the probe mechanism 1200 has to first contact and electrically connect with the light emitting device 1010. That is, after the high temperature inspection, the probe mechanism 1200 can maintain the contact with the light emitting device 1010, such that the voltage or the current signal can be directly applied to the light emitting device 1010 in the subsequent low temperature inspection. In other embodiments, the probe mechanism 1200 can also be removed from the substrate table 1100 temporarily and not in contact with the light emitting device after the high temperature inspection depending on demands of a user.

Next, when the cooling apparatus 1400 cools down the light emitting device 1010 to maintain the temperature thereof within the second temperature range T2, the probe mechanism 1200 can transmit a second driving signal S2 to the light emitting device 1010 for driving the light emitting device 1010 to generate light. Herein, the second driving signal S2 is greater or smaller than the first driving signal S1. Similarly, the second driving signal S2 can be provided through the power supply apparatus 1800 electrically connected to the probe mechanism 1200. In the present embodiment, the second driving signal S2 is, for example, a current signal and is substantially 120 mA.

When the probe mechanism 1200 drives the light emitting device 1010 within the second temperature range T2 so that the light emitting device 1010 generates light, the inspection machine 1000 of the present embodiment senses the light generated when the light emitting device 1010 is driven through the image-sensing apparatus 1500. At the same time, whether the LEDs on the LED light bar are lighted under low temperature is inspected rapidly so as to determine whether the light emitting device 1010 is an operative light emitting device under low temperature.

It should be noted that in order to increase the cooling speed, the inspection machine 1000 further includes at least one blowing mechanism 1420 disposed on one side or respective sides of the substrate table 1100. The blowing mechanism 1420 is capable of providing an airflow to the light emitting device 1010 to cool the light emitting device 1010.

In the present embodiment, the inspection machine 1000 includes a second moving apparatus M2. The second moving apparatus M2 is disposed below the substrate table 1100. The second moving apparatus M2 is mainly configured to move the heating apparatus 1300 and the cooling apparatus 1400, so as to move the heating apparatus 1300 toward the substrate table 1100 under high temperature or move the cooling apparatus 1400 toward the substrate table 1100 under low temperature. In other words, the second moving apparatus M2 is mainly used to move one of the heating apparatus 1300 and the cooling apparatus 1400 when the inspection is performed under different temperatures.

Additionally, in order for the image-sensing apparatus 1500 to scan and sense the lighting status of the light emitting device 1010 rapidly, the moving mechanism 1700 is disposed above the light emitting device 1010 and the image-sensing apparatus 1500 is installed on the moving mechanism 1700. Consequently, the moving mechanism 1700 is capable of moving the image-sensing apparatus 1500 so as to scan and sense the lighting status of the light emitting device 1010 rapidly. Further, the temperature-sensing apparatus 1600 can also be installed on the moving mechanism 1700. Accordingly, the moving mechanism 1700 is capable of moving the temperature-sensing apparatus 1600 for the temperature-sensing apparatus 1600 to sense the temperature of each of the LEDs on the LED light bar; however, the invention is not limited thereto.

In the high temperature inspection and the low temperature inspection aforementioned, instead of inspecting the light emitting quality of the light emitting device 1010, the image-sensing apparatus 1500 is majorly configured to sense whether the light emitting device 1010 can be lighted under different temperatures. Therefore, the inspection machine 1000 further includes an optical inspection apparatus 1900 disposed above the light emitting device 1010 and installed on the moving mechanism 1700. The moving mechanism 1700 is capable of moving the optical inspection apparatus 1900. The optical inspection apparatus 1900 is capable of measuring an optical property generated when the light emitting device 1010 is driven. In details, the optical inspection apparatus 1900 can be a sleeve or an integrating sphere for measuring MCD (millicandela, the unit for measuring light intensity). The sleeve and the integrating sphere are applied to measure an optical intensity and a luminous flux of the light emitting device 1010.

In the present embodiment, the inspection machine 1000 is an automated machine. Specifically, the inspection machine 1000 also includes an operator 1030 and an interface card 1040. The operator 1030 moves the first moving apparatus M1, the second moving apparatus M2, and the moving mechanism 1700 through the interface card 1040. At least one of the probe mechanism 1200, the heating apparatus 1300, the cooling apparatus 1400, and the moving mechanism 1700 can therefore be moved via the operation of the operator 1030. Furthermore, the operator 1030 can retrieve data, such as image data or temperature data, from at least one of the image-sensing apparatus 1500 and the temperature-sensing apparatus 1600 through the interface card 1040. In other words, the interface card 1040 is a motion control card or an image retrieval card.

Accordingly, in the inspection machine 1000 of the present embodiment, the substrate table 1100, the probe mechanism 1200, the heating apparatus 1300, the cooling apparatus 1400, the image-sensing apparatus 1500, the temperature-sensing apparatus 1600, and the moving mechanism 1700 are integrated, so that the volume and length of the assembly line required for inspecting the light emitting device 1010 can be greatly reduced. Conventionally, various machines for inspecting optical property and electrical property are usually disposed to perform various optical inspections and electrical inspections to a light emitting device (i.e. an LED light bar). The light emitting device is then placed into the inspection machines sequentially for measuring optical property and electrical performance of the light emitting device. Nevertheless, the space occupied by these inspection machine can not be reduced effectively; that is, the assembly line for inspecting the light emitting device can not be shortened.

As for the structure of the inspection machine 1000 disclosed in the present embodiment, the light emitting device can be disposed on the substrate table and does not need to be moved during the high temperature inspection, the low temperature inspection, and the optical quality inspection. Here, the light emitting device can be inspected by moving only the inspection apparatus required. Thus, the overall volume and the quantity of apparatuses of the inspection machine 1000 of the present embodiment are greatly reduced comparing to those of the conventional inspection machines. Moreover, the inspection machine 1000 of the present embodiment, cooperated with the manipulation of the operator, is automated through the use of the first moving apparatus M1, the second moving apparatus M2, and the moving mechanism 1700. In addition, the use of the image-sensing apparatus 1500 in the inspection machine 1000 of the present embodiment can replace artificial vision inspection to inspect whether the LEDs on the LED light bar are lighted. The inspection machine 1000 of the present embodiment thus has advantages such as fast speed, low labor cost, and precision.

Figure 4:
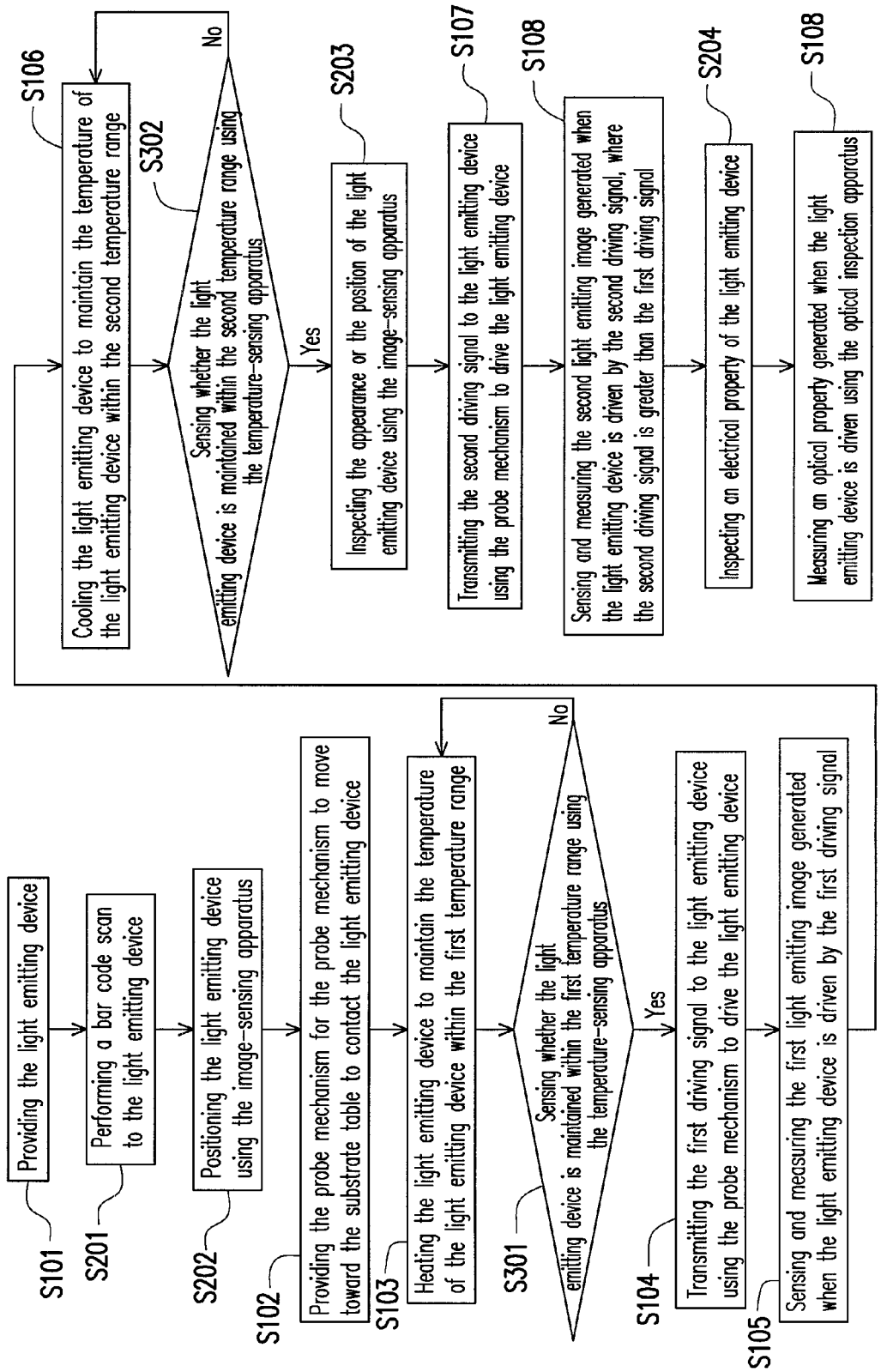
FIG. 4 is a schematic diagram illustrating a flowchart of an inspecting method according to an embodiment of the invention.

Accordingly, the present embodiment is also directed to an inspecting method capable of inspecting optical property and electrical property of the light emitting device 1010, as illustrated in FIG. 4. The inspecting method at least includes the following steps. Referring to step S101 in FIG. 4, firstly, the light emitting device 1010 aforementioned is provided. The light emitting device 1010 is, for instance, an LED light bar.

Next, step S102 is performed, where the probe mechanism 1200 is provided, so that the probe mechanism 1200 moves toward the substrate table 1100 to contact the light emitting device 1010. The operation of the probe mechanism 1200 can be referred to the above descriptions.

Then, in step S103, the light emitting device 1010 is heated for the temperature of the light emitting device 1010 to maintain within the first temperature range T1. The light emitting device 1010 is heated with the heating method adopting the heating apparatus 1300 as mentioned above, and the details are omitted hereinafter. In the process of heating the light emitting device 1010, the temperature-sensing apparatus 1600 can be used to sense whether the light emitting device 1010 is maintained within the first temperature range T1 as shown in step S301 of FIG. 4. In details, when the temperature-sensing apparatus 1600 senses the light emitting device 1010 to be maintained within the first temperature range T1, the subsequent step S104 can be maintained. On the contrary, when the temperature-sensing apparatus 1600 senses that the light emitting device 1010 is not maintained within the first temperature range T1, the light emitting device 1010 is then heated.

In step S104, the probe mechanism 1200 then transmits the first driving signal S1 to the light emitting device 1010 to drive the light emitting device 1010. The first driving signal S1 is implemented with the power supply apparatus abovementioned and can be referred to the above. The detailed illustration thereof is thus omitted hereinafter.

Thereafter, step S105 is carried out, where the first light emitting image generated when the light emitting device 1010 is driven by the first driving signal S1 is sensed and measured. The light emitting device 1010 is sensed and measured with the method adopting the image-sensing apparatus 1500 aforementioned, and the details are omitted hereinafter. Up to this point, an inspecting method for inspecting under high temperature is completed.

Afterwards, in step S106, the light emitting device 1010 is cooled for the temperature of the light emitting device 1010 to maintain within the second temperature range T2. The light emitting device 1010 is cooled with the cooling method adopting the cooling apparatus 1400 as mentioned above, and the details are omitted hereinafter. In the process of cooling the light emitting device 1010, the temperature-sensing apparatus 1600 can be used to sense whether the light emitting device 1010 is maintained within the second temperature range T2 as shown in step S302 of FIG. 4. In details, when the temperature-sensing apparatus 1600 senses the light emitting device 1010 to be maintained within the second temperature range T2, the subsequent step S107 can be maintained. On the contrary, when the temperature-sensing apparatus 1600 senses that the light emitting device 1010 is not maintained within the second temperature range T2, the light emitting device 1010 is then cooled.

Next, step S107 is carried out, the probe mechanism 1200 transmits the second driving signal S2 to the light emitting device 1010 to drive the light emitting device 1010. The second driving signal S2 is also implemented with the power supply apparatus above-mentioned and can be referred to the above. The detailed illustration thereof is thus omitted hereinafter.

Later, step S108 is performed and the second light emitting image generated when the light emitting device 1010 is driven by the second driving signal S2 is sensed and measured. The second driving signal S2 is greater than the first driving signal S1. Similarly, the light emitting device 1010 is sensed and measured with the method adopting the image-sensing apparatus 1500 aforementioned, and the details are omitted hereinafter. Up to this point, an inspecting method for inspecting under low temperature is completed.

In the inspecting method of FIG. 4, before the probe mechanism 1200 moves toward the substrate table 1100 to contact the light emitting device 1010, the inspecting method further includes positioning the light emitting device 1010 using an image-sensing apparatus 1500 as described in step S201. In the present embodiment, before the light emitting device 1010 is positioned, a bar code scan is further performed to the light emitting device 1010 as shown in S202.

It should be illustrated that after the light emitting device 1010 is cooled and before the second driving signal S2 is transmitted to the light emitting device 1010, the inspecting method further includes inspecting an appearance or a position of the light emitting device 1010 using the image-sensing apparatus 1500. In addition, after the step of sensing and measuring the second light emitting image is carried out, an electrical inspection is further performed to the light emitting device 1010 as shown in step S204. Herein, the electrical inspection is a Vf inspection, a $\Delta$Vf inspection, or a leakage current inspection. After the step of performing the electrical inspection to the light emitting device 1010 is carried out, the inspecting method further adopts the optical inspection apparatus 1900 to measure the optical property generated when the light emitting device 1010 is driven as shown in step S205. Herein, the measurement of the optical property includes measuring the optical intensity and the luminous flux of the light emitting device 1010.

Accordingly, the invention is further directed to an inspecting system capable of inspecting optical property and electrical property of the light emitting device. The inspecting system includes the substrate table, the probe mechanism, the heating apparatus, the cooling apparatus, and the image-sensing apparatus. The light emitting device is disposed on the substrate table. The probe mechanism moves toward the substrate table to contact with the light emitting device. The heating apparatus heats up the light emitting device such that the temperature of the light emitting device is maintained within a first temperature range. Moreover, a first driving signal is transmitted to the light emitting device using the probe mechanism to drive the light emitting device. The cooling apparatus cools the light emitting device such that the temperature of the light emitting device is maintained within a second temperature range. Moreover, a second driving signal is transmitted to the light emitting device using the probe mechanism to drive the light emitting device. The image-sensing apparatus is capable of sensing and measuring a first light emitting image generated when the light emitting device is driven by the first driving signal, and sensing and measuring a second light emitting image generated when the light emitting device is driven by the second driving signal. Here, the second driving signal is greater than the first driving signal.

In the inspecting system, before the probe mechanism moves toward the substrate table to contact the light emitting device, the light emitting device is further positioned using an image-sensing apparatus in the inspecting system. Additionally, before the light emitting device is positioned, a bar code scan is performed to the light emitting device in the inspecting system.

In the inspecting system, after the light emitting device is cooled and before the second driving signal is transmitted to the light emitting device, an appearance or a position of the light emitting device is inspected using an image-sensing apparatus in the inspecting system. After the second light emitting image is sensed and measured, an electrical property of the light emitting device is further inspected in the inspecting system.

After the light emitting device is cooled and before the second driving signal is transmitted to the light emitting device, an appearance or a position of the light emitting device is further inspected using an image-sensing apparatus in the inspecting system. After the second light emitting image is sensed and measured, the inspecting system further includes inspecting an electrical property of the light emitting device.

After the electrical property of the light emitting device is inspected, an optical property generated when the light emitting device is driven is further measured using an optical inspection apparatus in the inspecting system. Also, after the light emitting device is heated and before the light emitting device is driven, whether the light emitting device is maintained within the first temperature range is sensed using a temperature-sensing apparatus in the inspecting system.

After the light emitting device is cooled and before the light emitting device is driven, whether the light emitting device is maintained within the second temperature range is sensed using a temperature-sensing apparatus in the inspecting system.

It should be noted that the heating apparatus and the cooling apparatus of the inspecting system could not only be disposed in the same machine as shown in FIG. 1, but also be disposed in different machines in other embodiment, so as to heat or cool the light emitting device independently.

In summary, the inspection machine, the inspecting method, and the inspecting system of the invention at least have the following advantages. Herein, the substrate table, the probe mechanism, the heating apparatus, the cooling apparatus, the image-sensing apparatus, the optical inspection apparatus, the temperature-sensing apparatus, and the moving mechanism are integrated, so that the volume and length of the inspection assembly line required for inspecting the light emitting device can be greatly reduced. That is, the light emitting device disposed on the substrate table of the inspection machine in the present embodiment can undergo the high temperature inspection, the low temperature inspection, and the optical property quality inspection without moving its position. Therefore, the overall volume and the quantity of apparatuses of the inspection machine of the present embodiment are greatly reduced comparing to those of the conventional inspection machines.

Moreover, the inspection machine of the present embodiment, cooperated with the manipulation of the operator, is automated through the use of the first moving apparatus, the second moving apparatus, and the moving mechanism.

In addition, the use of the image-sensing apparatus in the inspection machine of the present embodiment can replace artificial vision inspection to inspect whether the LEDs on the LED light bar are lighted. The inspection machine of the present embodiment thus has advantages such as fast speed, low labor cost, and precision.

It will be apparent to those skilled in the art that various modifications and variations can be made to the structure of the disclosed embodiments without departing from the scope or spirit of the invention. In addition, any one of the embodiments or the scope of the claims does not need to achieve all of the objectives, advantages, or characteristics disclosed in the invention. The abstract and the title are merely used to facilitate the search for patents and are not intended to limit the application scope of the invention.

What is claimed is:

1. An inspection machine capable of inspecting optical property and electrical property of a light emitting device, the inspection machine comprising:
    a substrate table, wherein the light emitting device is disposed on thereon;
    a probe mechanism, disposed above the substrate table and capable of moving toward the substrate table to contact with the light emitting device;
    a heating apparatus, disposed below the substrate table and capable of heating the light emitting device such that a temperature of the light emitting device is maintained within a first temperature range, wherein the probe mechanism contacting the light emitting device is capable of transmitting a first driving signal to the light emitting device to drive the light emitting device when the light emitting device is within the first temperature range;
    a cooling apparatus, disposed below the substrate table and capable of cooling the light emitting device such that the temperature of the light emitting device is maintained within a second temperature range, wherein the probe mechanism contacting the light emitting device is capable of transmitting a second driving signal to the light emitting device to drive the light emitting device when the light emitting device is within the second temperature range;
    an image-sensing apparatus, disposed above the light emitting device and capable of sensing a light emitting image generated when the light emitting device is driven;
    a temperature-sensing apparatus, disposed above the light emitting device to sense a present temperature of the light emitting device; and
    a moving mechanism, disposed above the light emitting device and having the image-sensing apparatus disposed thereon, wherein the moving mechanism is capable of moving the image-sensing apparatus.

2. The inspection machine as claimed in claim 1, wherein the substrate table comprises a conveyor belt device capable of carrying and transporting the light emitting device.

3. The inspection machine as claimed in claim 1, wherein the heating apparatus comprises a heating block or a heating plate.

4. The inspection machine as claimed in claim 1, wherein the first temperature range substantially ranges from 120° C. to 200° C.

5. The inspection machine as claimed in claim 1, wherein the cooling apparatus comprises a water circulating system or a gas ejecting system.

6. The inspection machine as claimed in claim 1, wherein the second temperature range substantially ranges from 20° C. to 70° C.

7. The inspection machine as claimed in claim 1, wherein the second driving signal is greater or smaller than the first driving signal.

8. The inspection machine as claimed in claim 1, wherein the image-sensing apparatus comprises a line scan charge coupling device.

9. The inspection machine as claimed in claim 1, further comprising a power supply apparatus electrically connected to the probe mechanism and providing the first driving signal or the second driving signal.

10. The inspection machine as claimed in claim 1, further comprising an optical inspection apparatus disposed above the light emitting device and installed on the moving mechanism, wherein the moving mechanism is capable of moving the optical inspection apparatus and the optical inspection apparatus is capable of sensing an optical property generated when the light emitting device is driven.

11. The inspection machine as claimed in claim 1, further comprising a first moving apparatus and a second moving apparatus, wherein the first moving apparatus is disposed above the substrate table and capable of moving the probe mechanism for the probe mechanism to move toward or away from the substrate table, and the second moving apparatus is disposed below the substrate table and capable of moving the heating apparatus and the cooling apparatus for one of the heating apparatus and the cooling apparatus to move toward the substrate table.

12. The inspection machine as claimed in claim 1, further comprising at least one blowing mechanism disposed on one side or respective sides of the substrate table, wherein the blowing mechanism is capable of providing an airflow to the light emitting device to cool the light emitting device.

13. The inspection machine as claimed in claim 1, further comprising an operator and an interface card, wherein the operator moves at least one of the probe mechanism, the heating apparatus, the cooling apparatus, and the moving mechanism through the interface card, or retrieves data from at least one of the image-sensing apparatus and the temperature-sensing apparatus through the interface card.

14. The inspection machine as claimed in claim 13, wherein the interface card comprises a motion control card or an image retrieval card.

15. The inspection machine as claimed in claim 1, wherein the light emitting device comprises a light emitting diode light bar.

16. An inspecting method capable of inspecting optical property and electrical property of a light emitting device, the inspecting method comprising:
   providing a light emitting device;
   providing a probe mechanism for the probe mechanism to move toward the substrate table so as to contact the light emitting device;
   heating the light emitting device to maintain a temperature of the light emitting device within a first temperature range;
   transmitting a first driving signal to the light emitting device using the probe mechanism to drive the light emitting device;
   sensing and measuring a first light emitting image generated when the light emitting device is driven by the first driving signal;
   cooling the light emitting device to maintain the temperature of the light emitting device within a second temperature range;
   transmitting a second driving signal to the light emitting device using the probe mechanism to drive the light emitting device; and
   sensing and measuring a second light emitting image generated when the light emitting device is driven by the second driving signal, wherein the second driving signal is greater than the first driving signal.

17. The inspecting method as claimed in claim 16, before moving the probe mechanism toward the substrate table to contact the light emitting device, further comprising:
   positioning the light emitting device using an image-sensing apparatus.

18. The inspecting method as claimed in claim 17, before positioning the light emitting device, further comprising:
   performing a bar code scan to the light emitting device.

19. The inspecting method as claimed in claim 16, after cooling the light emitting device and before transmitting the second driving signal to the light emitting device, further comprising:
   inspecting an appearance or a position of the light emitting device using an image-sensing apparatus.

20. The inspecting method as claimed in claim 16, after sensing and measuring the second light emitting image, further comprising:
   inspecting an electrical property of the light emitting device.

21. The inspecting method as claimed in claim 20, after inspecting the electrical property of the light emitting device, further comprising:
   measuring an optical property generated when the light emitting device is driven using an optical inspection apparatus.

22. The inspecting method as claimed in claim 16, after heating the light emitting device and before driving the light emitting device, further comprising:
   sensing whether the temperature of the light emitting device is maintained within the first temperature range using a temperature-sensing apparatus.

23. The inspecting method as claimed in claim 16, after cooling the light emitting device and before driving the light emitting device, further comprising:
   sensing whether the temperature of the light emitting device is maintained within the second temperature range using a temperature-sensing apparatus.

24. An inspecting system capable of inspecting optical property and electrical property of a light emitting device, the inspecting system comprising:
   a substrate table, wherein the light emitting device is disposed on thereon;
   a probe mechanism, moving toward the substrate table to contact the light emitting device;
   a heating apparatus, heating the light emitting device such that a temperature of the light emitting device is maintained within a first temperature range, and transmitting a first driving signal to the light emitting device using the probe mechanism to drive the light emitting device;
   a cooling apparatus, cooling the light emitting device such that the temperature of the light emitting device is maintained within a second temperature range, and transmitting a second driving signal to the light emitting device using the probe mechanism to drive the light emitting device; and
   an image-sensing apparatus, sensing and measuring a first light emitting image generated when the light emitting device is driven by the first driving signal, and sensing and measuring a second light emitting image generated when the light emitting device is driven by the second driving signal, wherein the second driving signal is greater than the first driving signal.

25. The inspecting system as claimed in claim 24, wherein before moving the probe mechanism toward the substrate table to contact the light emitting device, further comprises positioning the light emitting device using an image-sensing apparatus.

26. The inspecting system as claimed in claim 25, wherein before positioning the light emitting device, further comprises performing a bar code scan to the light emitting device.

27. The inspecting system as claimed in claim 24, wherein after cooling the light emitting device and before transmitting the second driving signal to the light emitting device, further comprises inspecting an appearance or a position of the light emitting device using an image-sensing apparatus.

28. The inspecting system as claimed in claim 24, wherein after sensing and measuring the second light emitting image, further comprises inspecting an electrical property of the light emitting device.

29. The inspecting system as claimed in claim 28, wherein after inspecting the electrical property of the light emitting device, further comprises measuring an optical property generated when the light emitting device is driven using an optical inspection device.

30. The inspecting system as claimed in claim 24, wherein after heating the light emitting device and before driving the light emitting device, further comprises sensing whether the temperature of the light emitting device is maintained within the first temperature range using a temperature-sensing apparatus.

31. The inspecting system as claimed in claim 24, wherein after cooling the light emitting device and before driving the light emitting device, further comprises sensing whether the temperature of the light emitting device is maintained within the second temperature range using a temperature-sensing apparatus.

32. The inspecting system as claimed in claim 24, wherein the heating apparatus and the cooling apparatus are disposed in the same machine, or disposed in different machines, so as to heat or cool the light emitting device independently.

* * * * *